United States Patent [19]

Busch et al.

[11] Patent Number: 5,036,495
[45] Date of Patent: Jul. 30, 1991

[54] MULTIPLE MODE-SET FOR IC CHIP

[75] Inventors: Robert E. Busch, Colchester, Vt.;
William P. Hovis, Rochester, Minn.;
Theodore M. Redman, Milton, Vt.;
Endre P. Thoma, Colchester, Vt.;
James A. Yankosky, Essex Junction, Vt.

[73] Assignee: International Business Machines Corp., Armonk, N.Y.

[21] Appl. No.: 469,880

[22] Filed: Dec. 28, 1989

[51] Int. Cl.⁵ .............................................. G11C 8/00
[52] U.S. Cl. .................................. 365/233; 365/233.5
[58] Field of Search ............. 365/233, 189.02, 189.03, 365/233.5

[56] References Cited

U.S. PATENT DOCUMENTS 4,159,541  6/1979  Ward et al. .......................... 365/233
4,845,664  7/1989  Aichelmann, Jr. .................. 364/900

Primary Examiner—Joseph A. Popek
Assistant Examiner—Jack A. Lane
Attorney, Agent, or Firm—Calfee, Halter & Griswold

[57] ABSTRACT

A method and device for setting at least three operating modes of a memory device is provided. The voltage signal is sensed at a first input and an enable signal is sensed at a second input. When an enable signal is received at a second input the memory device operates at the first operating mode if the voltage state at the first input is low; it operates at a second mode if the voltage state at the second is high; and it operates at a third operating mode if the voltage at the first input changes after the enable signal is received at the input. Also a four mode operation can be achieved.

8 Claims, 5 Drawing Sheets

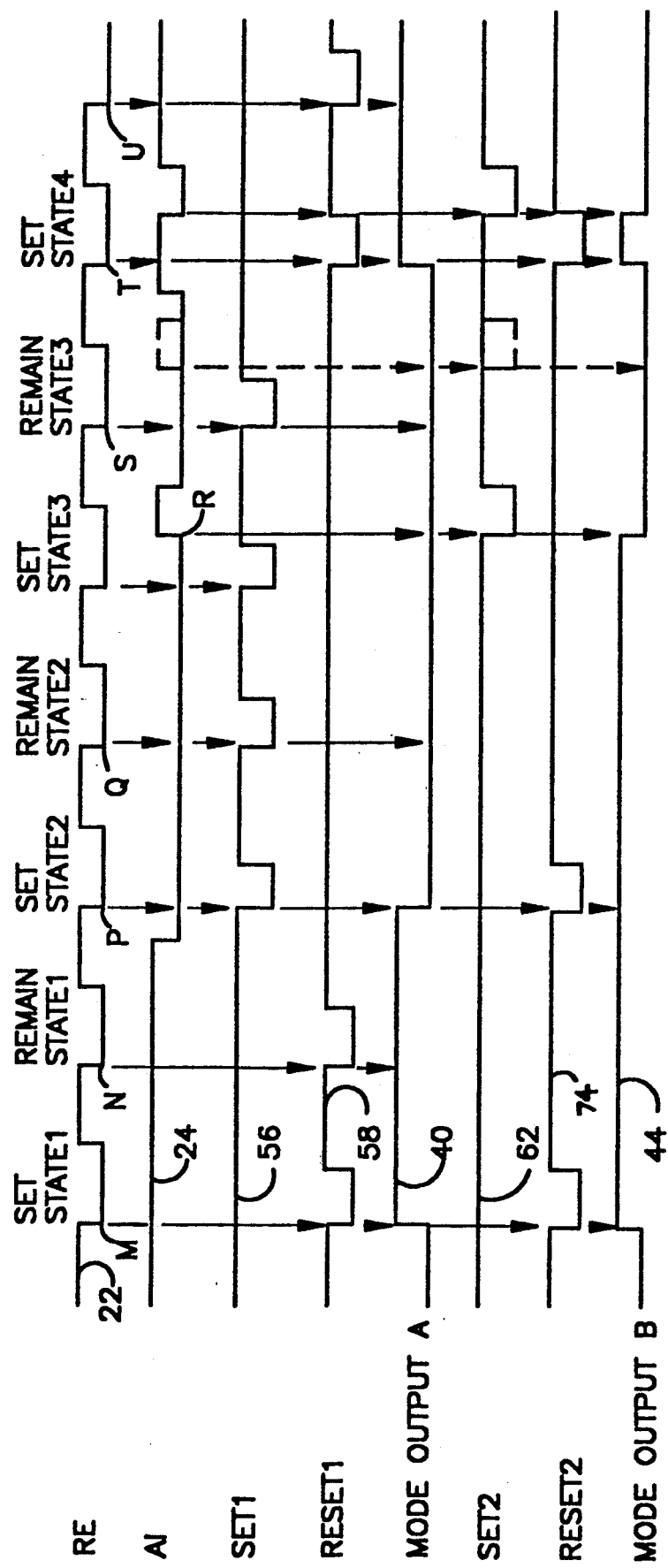

MULTIPLE MODE-SET FOR IC CHIP

BACKGROUND OF THE INVENTION

In the production and utilization of different types of integrated circuit (IC) chips and particularly with respect to dynamic random access memories (hereinafter DRAMs) it is sometimes desirable to have a single chip configuration capable of operating in different modes; i.e. for one particular application it might be desirable that the DRAM operate in a Page mode (e.g. a mode where CAS is used to trap addresses) and, another mode where the DRAM operates in a Static Column mode in such a case the write pulse can trap addresses). It is possible to design two different inputs to the chip so that depending upon the input, the chip will operate in either a Page mode or a Static Column mode. However, this requires two separate chips and two separate part numbers and, thus, a common chip cannot be used to operate in both modes. Yet for many reasons it may be desirable to have the same chip operate in two or more different modes. An example of operation of a DRAM is described in a third mode in U.S. Pat. No. 4,845,664, "On-Chip Bit Reordering Structure" (assigned to IBM), the teachings of which are incorporated herein by reference.

It is generally desirable to provide multiple operating modes utilizing a single chip configuration, so as to not require separate chips and part numbers. Conventionally, memory chips are operated in default modes. If different modes are needed, different chips must be provided. A single chip, able to operate in multiple modes, saves manufacturing and inventory costs. Manufacturing unique integrated circuits requires multiple sets of masks, test specifications, assembly specifications and inventory control documents which all add to the cost of the chip.

There have been prior attempts at providing dual state mode recognition; for example, U.S. Pat. No. 4,159,541 to Ward, et al. shows a mode selector which selects a "read" or "write" operation. However, this patent does not show selection between two different types of operating modes of a DRAM and, especially, wherein there is a third mode which is actuated if the mode switches during certain conditions and is reset to the original mode.

SUMMARY OF THE INVENTION

According to the present invention a method and device for setting three operating modes of a memory device especially a DRAM, is provided. The invention includes the steps of monitoring the voltage state at a first input to the memory device. When an enable signal has been received at a second input, the memory device operates at the first operating mode if the voltage state at the first input is low, the memory is operated at a second operating mode if the voltage state at the first input is high, and the memory device is operated in the third operating mode if the voltage at the first input changes after the enable signal is received at the second input. Also a fourth mode can be provided.

DESCRIPTION OF THE DRAWING

FIG. 2A is a timing or pulse diagram for the operation of the circuit in FIG. 2;

DESCRIPTION OF THE PREFERRED EMBODIMENTS

Figure 1:
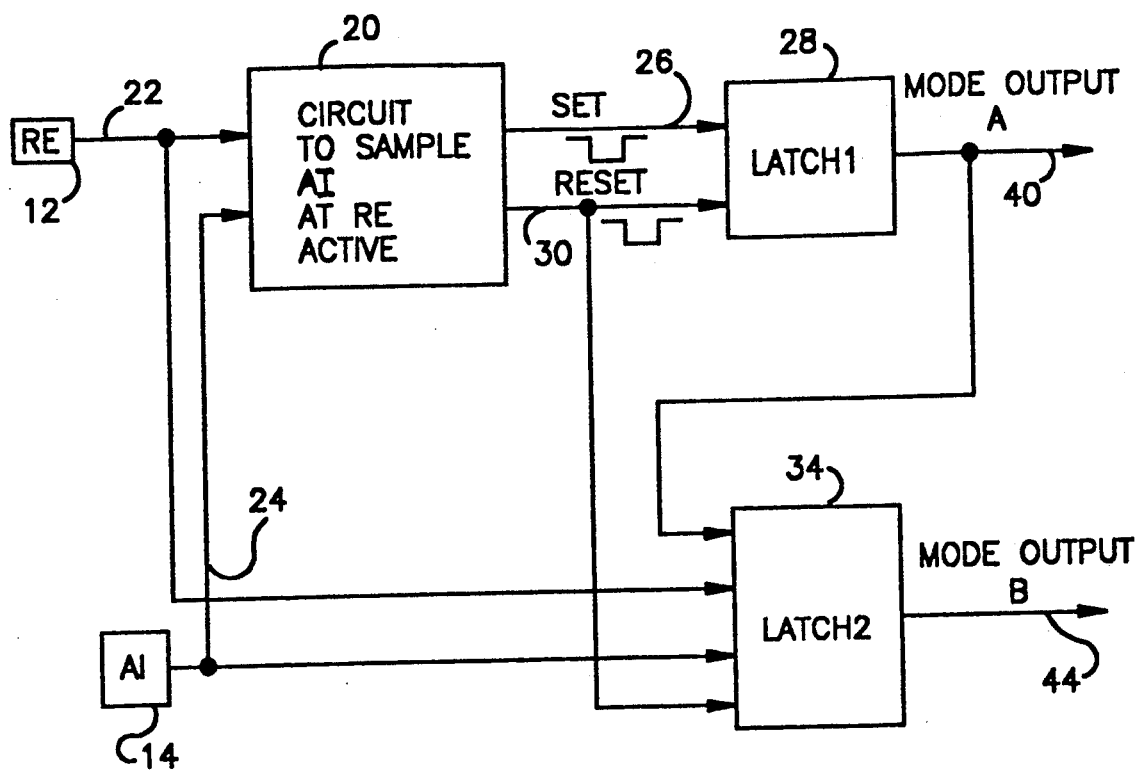
FIG. 1 is a block diagram showing a circuit for providing three different modes of operation of the present invention utilizing two input pads or pins.
Figure 3:
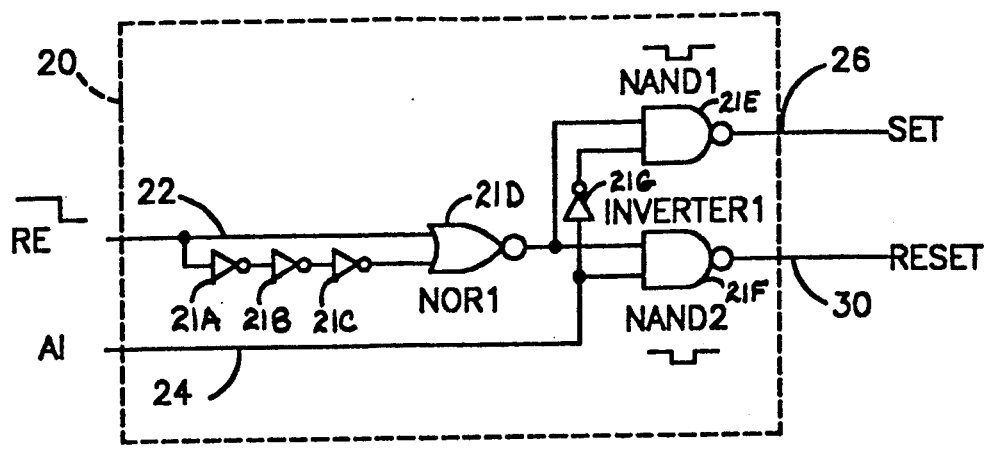
FIG. 3 is a detailed circuit diagram of circuit block 20 of FIG. 1.

Referring now to the drawings and for the present to FIG. 1, a block diagram at a relatively high level is shown of the invention for three separate operating modes according to this invention, which can be used as input to an Integrated Circuit Dynamic Random Access Memory (IC DRAM) chip. This circuit includes an access pad or pin 12 to which the row enable (RE) signal is supplied. A second pin 14 is provided which is an auxiliary input (AI). A sample and hold circuit 20 is provided to sample the AI at pin 14 state when RE, pin 12, transitions to an active logic low state. An example of a sample and hold circuit 20 is shown in FIG. 3. The circuit 20 is a single shot output, which includes a series of inverters 21a, 21b and 21c connected to NOR gate 21d. The NOR gate 21d is connected to a pair of NAND gates 21e and 21f, which gates are interconnected by an inverter 21g. The output is gated through NAND gate 21e wherever the AI at pin 14 is at low logic state and gated through NAND gate 21f whenever the AI at pin 14 is in the high logic state.

Figure 4:
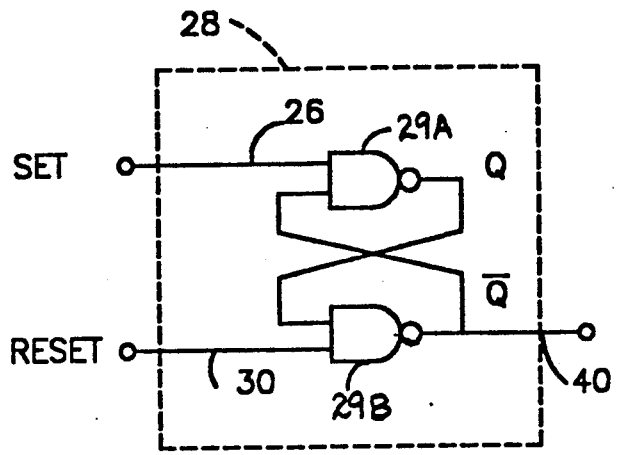
FIG. 4 is a detailed circuit diagram of circuit block 28 of FIG. 1.
Figure 5:
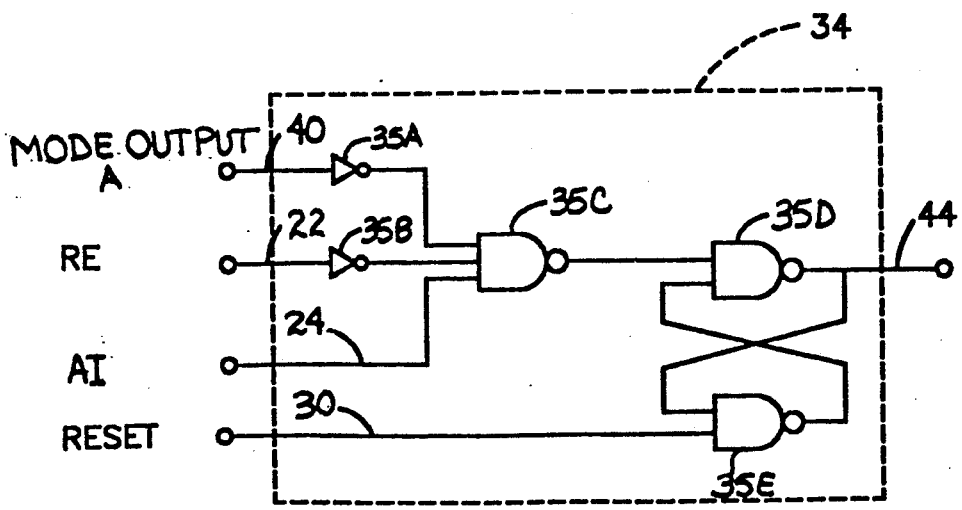
FIG. 5 is a detailed circuit diagram of circuit block 34 of FIG. 1.

The pin 12 is connected through line 22 to the circuit 20 and the pin 14 is connected to the circuit 20 through line 24. One output from the circuit 20 is connected from gate 21e through line 26 to a latch 28. The purpose of this latch is to remain in a given condition unless actuated by a signal. An example of the latch 28 is shown in FIG. 4. The latch 28 includes a pair of negative AND (NAND) gates 29a and 29b. The line 26 is used for a set signal to be given as will be described presently. A line 30 is connected from the gate 21f of circuit 20 to the latch 28, which is used for a reset signal, which will also be described presently. A line 22 is provided, which connects pin 12 to a latch 34. An example of latch 34 is shown in FIG. 5. Latch 34 includes a pair of inverters 35a and 35b connected to a NAND gate 35c which in turn is connected to NAND gates 35d and 35e. Line 24 also connects the AI at pin 14 to the latch 34. Line 30 connects the reset side of the circuit 20 to the latch 34.

Latch 28 has an output line 40, which is connected to the latch 34. The line 40 will be referred to as the mode output A line, and it is the condition of this line which determines whether the chip is in the Page mode or Static Column mode. Latch 34 also has a line 44 which will be referred to as mode output B line. This line provides a signal that indicates (in conjuction with the signal on the mode output A line) the third and fourth DRAM operating modes.

Figure 1A:
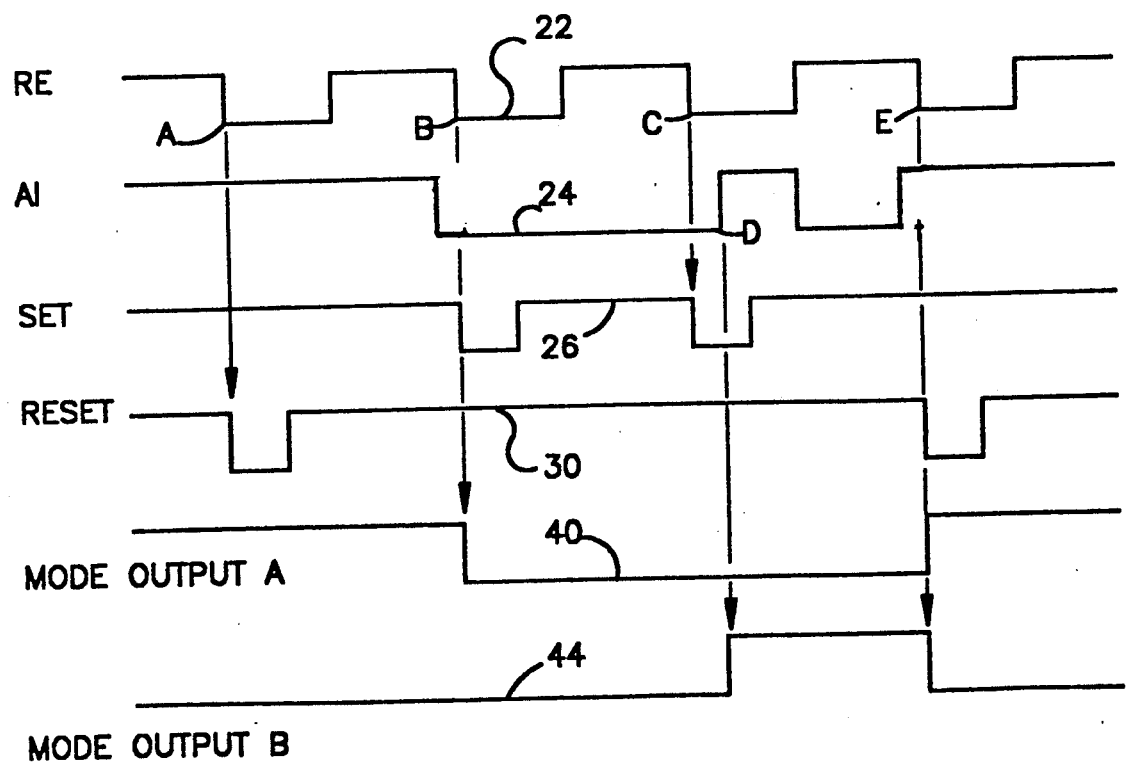
FIG. 1A is a timing or pulse diagram for the circuit for FIG. 1.

Referring now to FIG. 1A, a timing diagram or pulse diagram of the phases, is shown. Each of the phases represents whether the line is in a logic "high" or logic "low" state. The Row Enable line 22 pulses between an active low state and an inactive high state. The state of the AI line 24, in combination with the RE line 22, is used to establish the mode of operation. The SET line 26 and the RESET line 30 are responsive through circuit 20 to both the RE line 22 and AI line 24. The Mode Output A line 40 is responsive to latch 28, and the Mode Output B line 44 is responsive to latch 34. This can be seen in the diagram of FIG. 1.

FIG. 1A assumes a default mode with lines 22, 24, 26, 30 and 40 in a high state and Mode Output B line 44 in a low state. When the Row Enable line 22 goes low as shown at A indicating a circuit selection, a RESET pulse is generated, detecting that AI line 24 was at a high state. Output lines 40 and 44 remain in their original reset or default states, and the mode of operation does not change.

However, if the RE line 22 goes low as shown at B when the AI line 24 has been actuated to a low state, operation of the set line 26 changes the output line 40 through latch 28 from a high state to a low state, which will switch the mode of operation. Subsequent pulsing of the RE line 22 as shown at C with AI line 24 in its low state, while actuating Set line 26, nevertheless, will maintain the output line 40 in its low or second mode. However, if the AI line 24 goes high during the active low period of line 22, as shown at D, output line 40 stays in its low state but the mode output line B 44 is activated to its high state. Thus, this represents a third operating mode which is achieved only if the AI line 24 is pulsed high with output line 40 in its low state. When the RE line 22 goes active low with the AI line 24 in its high state as shown at E, Reset line 30 is actuated, resetting both latches. This will bring output line 40 high and output line 44, low, thus, returning to the default mode.

Thus, it can be seen that with two pins, and two latches, output line 40 can be switched back and forth between two desired modes of operation. Moreover, second output line 44, which is held low during the selection of the first two modes, can be changed to a high state to provide a third mode of operation with respect to the line 40.

Figure 2:
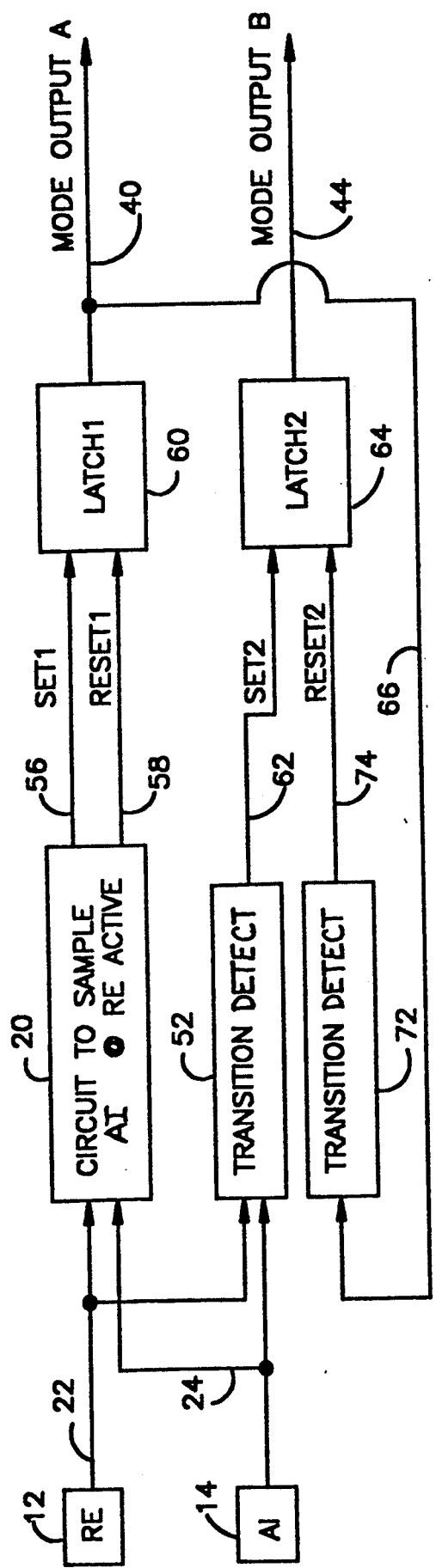
FIG. 2 is a block circuit diagram of a circuit for operating in four separate modes utilizing two input pads or pins.
Figure 6:
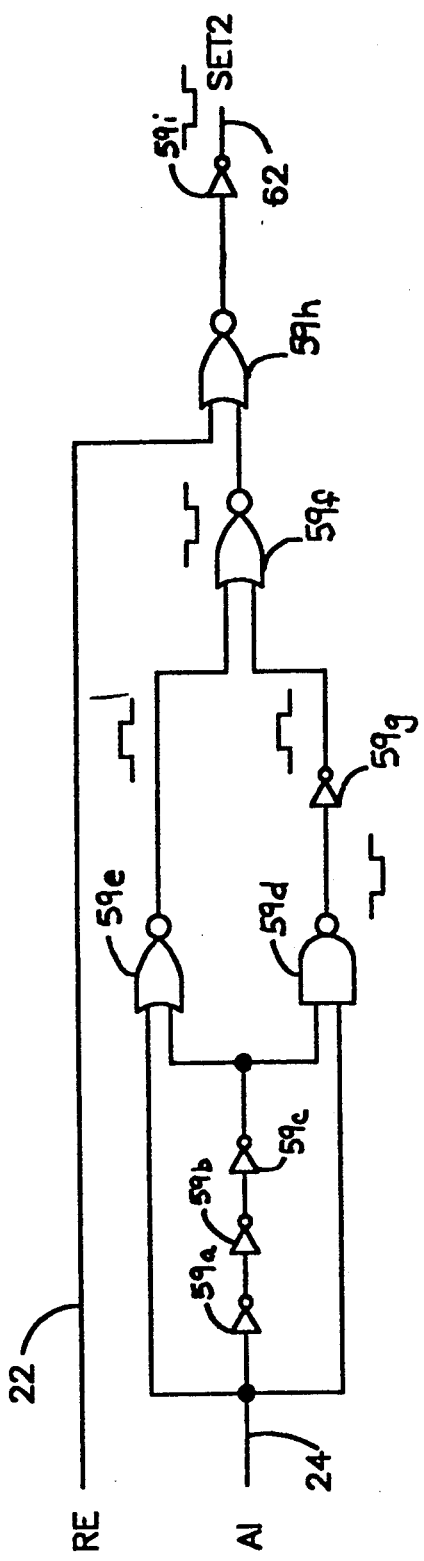
FIG. 6 is a detailed circuit diagram of circuit block 52 of FIG. 2.
Figure 7:
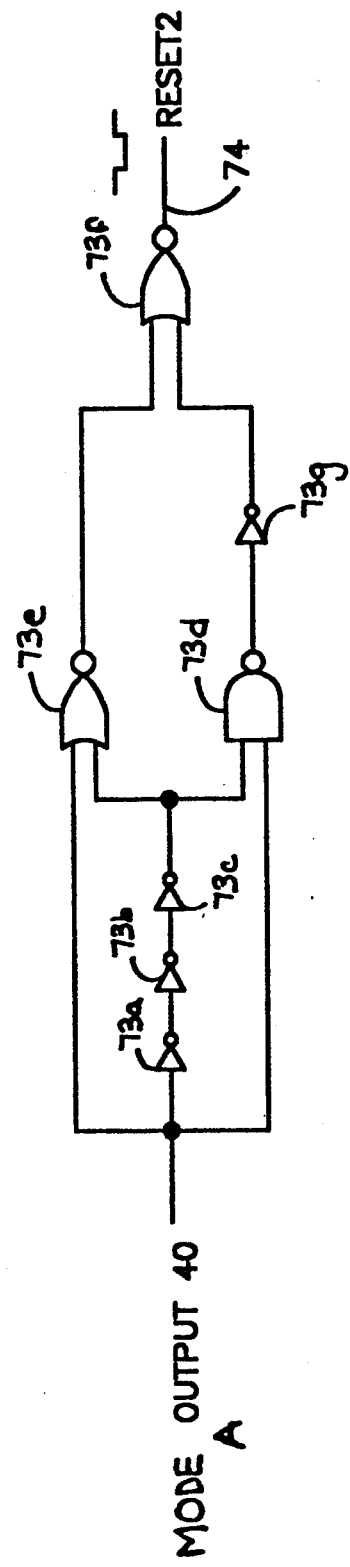
FIG. 7 is a detailed circuit diagram of circuit block 72 of FIG. 2.

Referring now to FIG. 2, a circuit with four-way operation for four operating modes is shown. As in FIG. 1, there is a Row Enable (RE) pad or pin 12 and an AI pad or pin 14. Circuit 20 which is the same as circuit 20 in FIG. 1, (in combination with latch 60 which will be described presently) will provide a sample and hold of the state of the AI pin 14. Line 22 connects the pad 12 to the circuit 20 and line 24 connects the AI pad 14 to the circuit 20. AI pad 14 is also connected by line 24 to a transition detect circuit 52. An example of transition detect circuit 52 is shown in FIG. 6. The circuit 52 includes inverters 59a, 59b and 59c connected in series with each other and to a NAND gate 59d and a NOR gate 59e connected in parallel with each other. Gate 59e is connected directly to NOR gate 59f and gate 59d is connected through inverter 59g to gate 59f, which in turn is connected through NOR gate 59h to inverter 59i. The Row Enable pad 14 is also connected to the gate 59h of transition detect circuit 52 by line 22. The circuit 20 has an output line 56 which is labeled as "Set 1" and an output line 58 labled "Reset 1", both of which are connected to a latch 60, which is similar in design to the latch 28 shown in FIGS. 1 and 4. The transition detect circuit 52 is connected by line 62, which is labeled as "Set 2", to a latch 64 which is similar to latch 60. A pulse on line 62 is generated only when the RE line 22 is in a "low" logic state coinciding with a "high to low" or "low to high" logic transition on AI lines 24. Latch 60 provides output 40, and latch 64 provides output 44. Line 40 in conjunction with line 44 can represent four separate modes, which will now be described with respect to the timing diagram shown in FIG. 2A.

FIG. 2A assumes an initial condition for the circuits in FIG. 2 having lines 22, 24, 56, 58, 62 and 74 in a high state, and having lines 40 and 44 in a low state. As shown in FIG. 2A, when the RE line 22 goes low as shown at M the Reset 1 line 58 is actuated and Latch 60 returns to a reset state with line 40 changing to a high state. The transition on line 40 actuates a transition detector 72. Transition detector 72 includes Inverters 73a, 73b and 73c connected in series to NAND gate 73d and NOR gate 73e which are connected in parallel. NOR gate 73e is connected directly to NOR gate 73f an NAND gate 73d is connected through inverter 73g to NOR gate 73f. Latch 64 returns to a reset state with line 44 changing to a high state. Lines 40 and 44 are now set to state 1. If in this first state RE is received as shown at N, this will actuate reset 1 line 58 only, which will not cause either the lines 40 or 44 to change from state 1. However, if the AI line 24 goes low prior to line 22 going low (as at P), this will actuate the Set 1 line 56 and in turn the Reset 2 line 74. The Set 1 line 56 will cause the line 40 to go low and the Reset 2 line will maintain the line 44 high, thus, giving a "second" state wherein line 40 is low and line 44 is high. If, in this state again the RE line 22 is transitioned low as at Q this will actuate the Set 1 line 56, but since the line 40 is low, it will maintain this in a low condition and there will be no change in state 2. If, however, the AI line 24 goes high after the RE signal is received on line 22 as at R, this will cause the line 44 to go low setting a third state in which both the lines 40 and 44 are low. Again, if RE is received with line 24 low as at S, Set 1 line 56 and optionally set 2 line 62 is actuated, but since lines 40 and 44 are already low, no change in the "third" state will occur. The dotted lines on AI and Set 2 after S shows the mode detect circuits remaining in state 3, even if AI line 24 goes high, or remains low. If the AI line 24 is high and the RE line 22 goes low as at T, this will actuate the Reset 1 line 58, which will bring the line 40 high and actuate Reset 2 line 74 which will reset Latch 2 circuit 64 and line 44 rises. Following this, the action of AI line 24 falling while RE line 22 is active low, will actuate the Set 2 line 62 so as to set line 44 low, which represents a fourth state. If the AI line 24 is high and the RE line 22 goes low as at U, Reset 1 line 58 will maintain line 40 high and line 44 will stay low thus remaining in the fourth state. Thus, with this configuration, four separate states of lines 40 and 44 can be maintained.

While several embodiments in this invention have been shown and described, various adaptions and modifications can be made without departing from the scope of the invention as defined in the appended claims.

What is claimed is:

1. A method for setting various operating modes of a memory device comprising the steps of: monitoring the voltage state at a first input to the memory device when an enable signal has been received and held active at a second input to the memory device; operating the memory device in a first operating mode if the voltage state of the first input is at a first value; operating a memory device in a second operating mode different from said first operating mode if the voltage state of the first input is at a second value different from the first value; and operating the memory in a third operating mode different from said first and second operating modes if the voltage state of the first input changes while the enable signal is received and held active at the second input.

2. The method as defined in claim 1 wherein the memory device is returned to the first mode if the enable signal is received at the second input when the voltage state of the first input is at said first value.

3. A device for setting various operating modes of a memory device responsive to changes in voltage states wherein the voltage state is monitored at a first input to the memory device when an enable signal has been received and held active at a second input to the memory device comprising: means to monitor the voltage state at said first input pad, means to monitor the voltage state of said enable signal at said second input pad, circuit means connected to said first and second input pads and to first and second output lines to provide a first pair of output signals on said first and second output lines to the memory device if the voltage state at the first pad is at a first value and a second pair of output signals different from said first pair of output signals on said first and second output lines if the voltage state is at a second value different from the first value, and a third pair of output signals different from said first and second pairs of output signals on said first and second output lines if the voltage state of the first input pad changes while the enable signal is received and held active at said second input pad to thereby provide selected modes of operation.

4. The device as defined in claim 3 including means to return the device to the first mode if the enable signal is received at the second input when the voltage state of the first input is at said first value.

5. The device as defined in claim 4 including latch means to maintain said circuit means in the selected mode of operation.

6. The device as defined in claim 4 including a sample and hold circuit, the input of which is connected to the first input pad to detect incoming voltage levels.

7. A method for setting various operating modes of a memory device comprising the steps of: monitoring the voltage state at a first input to the memory device when an enable signal has been received and held active at a second input to the memory device; operating the memory device in a first operating mode if the voltage state of the first input is at a first value; operating a memory device in a second operating mode different from said first operating mode if the voltage state of the first input is at a second value different from the first value; operating the memory in a third operating mode different from said first and second operating modes if the voltage state of the first input changes from the first value to the second value while the enable signal is received and held active at the second input, and operating the memory in a fourth operating mode different from said first, second and third operating mode if the voltage state at the first input changes from the second value to the first value while the enable signal is received and held active at the second input.

8. A device for setting various operating modes of a memory device responsive to changes in voltage states wherein the voltage state is monitored at a first input to the memory device when an enable signal has been received and held active at a second input to the memory device comprising: means to monitor the voltage state at said first input pad, means to monitor the voltage state of said enable signal at said second input pad, circuit means connected to said first and second input pads and to first and second output lines to provide a first pair of output signals on said first and second output lines to the memory device if the voltage state at the first pad is at a first value and a second pair of output signals different from said first pair of output signals on said first and second output lines if the voltage state is at a second value different from the first value, a third pair of output signals different from said first and second pairs of output signals on said first and second output lines if the voltage state of the first input pad changes from the first value to the said second value while the enable signal is received and held active at said second pad, and a fourth pair of output signals different from said first, second and third pairs of output signals on said first and second output lines if the voltage state at the first pad changes from the second value to the first value while the enable signal is received and held active at said second pad to thereby provide selected modes of operation.

* * * * *